United States Patent
Xu et al.

(10) Patent No.: US 9,306,503 B2
(45) Date of Patent: Apr. 5, 2016

(54) SYSTEMS AND METHODS FOR COMBINING POWER THROUGH A TRANSFORMER

(71) Applicant: Intel Corporation, Santa Clara, CA (US)

(72) Inventors: Hongtao Xu, Beaverton, OR (US); Georgios (Yorgos) Palaskas, Portland, OR (US); Parmoon Seddighrad, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 14/165,152

(22) Filed: Jan. 27, 2014

(65) Prior Publication Data

US 2015/0214896 A1    Jul. 30, 2015

(51) Int. Cl.
*H03F 1/02*  (2006.01)
*H03F 3/217*  (2006.01)
*H03F 3/19*  (2006.01)
*H03F 3/189*  (2006.01)
*H03F 3/21*  (2006.01)

(52) U.S. Cl.
CPC .............. *H03F 1/0277* (2013.01); *H03F 3/189* (2013.01); *H03F 3/211* (2013.01); *H03F 2200/537* (2013.01); *H03F 2200/541* (2013.01)

(58) Field of Classification Search
USPC ................. 330/124 R, 295, 53, 84, 286, 301
See application file for complete search history.

(56) References Cited

U.S. PATENT DOCUMENTS

| | | | |
|---|---|---|---|
| 8,188,788 B2 * | 5/2012 | Lee | 330/51 |
| 8,502,598 B2 | 8/2013 | Seddighrad et al. | |
| 9,024,687 B2 * | 5/2015 | Karthaus | 330/124 R |

* cited by examiner

*Primary Examiner* — Hieu Nguyen
(74) *Attorney, Agent, or Firm* — Eschweiler & Associates, LLC

(57) ABSTRACT

A system for combining power includes a plurality of branches and a secondary winding. The plurality of branches are configured to provide branch power. Each of the branches contribute to the branch power at non-peak power. The secondary winding is configured to combine the branch power from the plurality of branches into an output power.

20 Claims, 6 Drawing Sheets

PEAK POWER

SYSTEMS AND METHODS FOR COMBINING POWER THROUGH A TRANSFORMER

BACKGROUND

Communication systems require levels of power in order to properly provide data for transmission. One level of power is the peak or maximum power. It is generally understood that power efficiency at peak power is important. However, newer and advanced devices use other levels of power below peak power. The efficiency at peak power is important, however efficiency at other levels is also important.

Generally, communication systems utilize a particular technology for exchanging information. At a first device, a transmitter uses the particular technology to generate and transmit a communication signal. At a second device, a receiver uses the particular technology to receive the communication signal.

One technique for providing the required levels of power is to use transformer combining. Here, multiple transformer windings are used to combine power from multiple power amplifiers to yield the peak power. However, these techniques are problematic at providing efficient power at other power levels.

Thus, there is a continuing need to provide efficient power at multiple power levels for communication systems.

DETAILED DESCRIPTION

Figure 1:
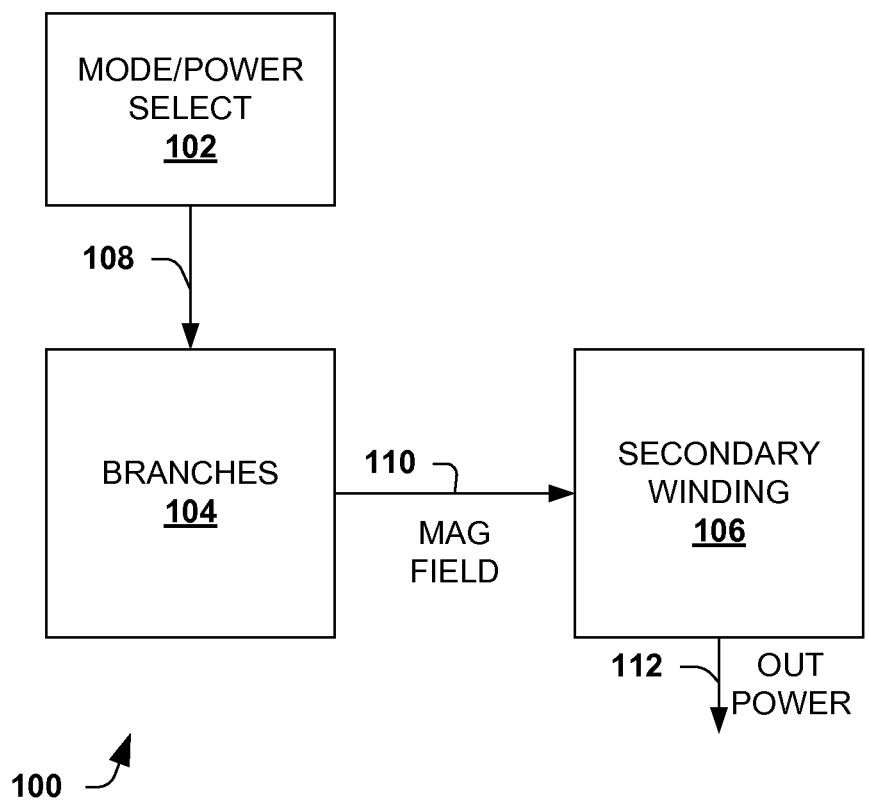
FIG. 1 is a simplified block diagram illustrating a power combining system.

The systems and methods of this disclosure are described with reference to the attached drawing figures, wherein like reference numerals are used to refer to like elements throughout, and wherein the illustrated structures and devices are not necessarily drawn to scale.

FIG. 1 is a simplified block diagram illustrating a power combining system 100. The system 100 combines power at a combine ratio and provide the power at an enhanced efficiency at power levels including, but not limited to, peak power and back-off power. The system 100 is provided in a simplified format in order to facilitate understanding.

The system 100 includes a mode select component 102, branches 104 and a secondary winding 106. The system 100 is configured to have a combine ratio, which indicates transformer combine ratios. Some examples of suitable combine ratios include, for example, 2:1, 4:1, and the like. The mode select component 102 is configured to select and/or control power levels by sending and/or using signals 108 to the branches 104. The mode select component 102 can also be configured to control other aspects of the system, including, for example, monitoring an output power 112, determining the selected power level, receiving input to select the power level, and the like.

The branches 104 are configured to provide power 110 to the secondary winding 106. The secondary winding 106 is configured to combine the power 110 into the output power 112 according to the combine ratio, which is described above. The branches 104 generally include a differential pair of inverters/amplifiers, one or more power sources, and an inductor coil for conveying a branch output power. The branch output power of the branches 104 is collectively referred to as the branches power 110.

The branches 104 are configured to have all amplifiers ON or in an ON state for peak power and half ON and half OFF for back-off power. It is appreciated other power output levels are contemplated. Thus, for the back-off power, each branch has at least one inverter/amplifier ON. In the ON state, the amplifiers provide an AC voltage. In one example, an amplifier in the ON state provides a set amount of power. In another example, an amplifier in the ON state provides a configurable amount of power from a full power to one or more levels below the full power.

The amplifiers in the OFF state provide a connection to ground or AC ground. In contrast, other conventional approaches use configurations where amplifiers for an entire branch are turned OFF for lower power levels, such as the back-off power. So doing results in unwanted power consumption and decreases power efficiency. Additionally, the other approaches do not provide a connection to AC ground.

As stated above, the secondary winding 106 is configured to combine the branches power 110 into the output power 112. The secondary winding 106 includes a plurality of inductor coils, typically one coil for each of the branches 104. The coils receive the branches power 110 and combine the individual power into the output power 112.

Figure 2:
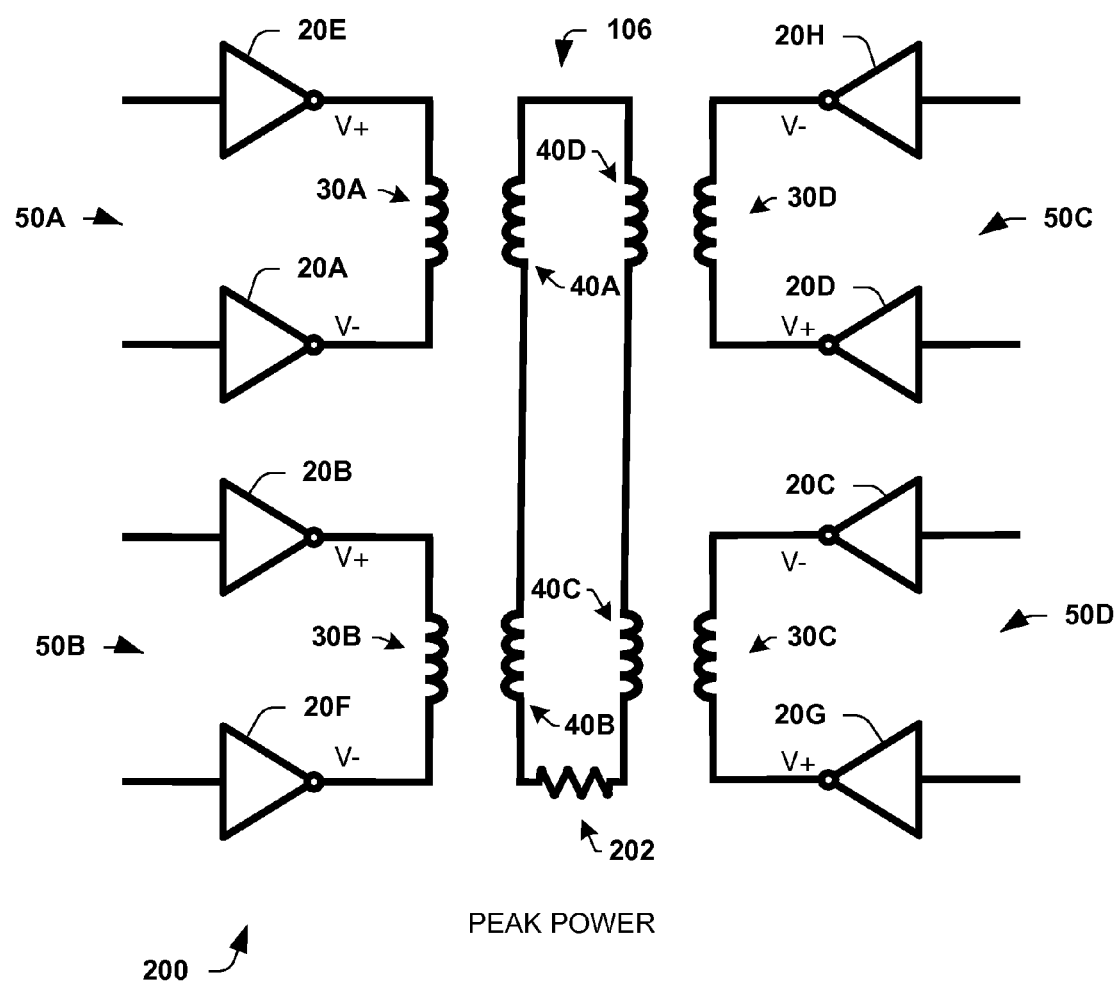
FIG. 2 is a diagram illustrating a power combining system operating at peak power.

FIG. 2 is a diagram illustrating a power combining system 200 operating at peak power. The system 200 combines power using a combine ratio of 4:1, in this example. However, it is appreciated that other suitable combine ratios are contemplated.

The system 200 includes a plurality of branches 50 and a secondary winding 106. The branches 50 can be utilized as the branches 104 in system 100, described above. Similarly, the secondary winding 106 can be used as the secondary winding 106 in the system 100, described above. The system 200 is shown configured to efficiently provide peak power.

The branches 50 include a first branch 50A, a second branch 50B, a third branch 50C and a fourth branch 50D. The branches 50 are differential in that each supply differential power, as indicated by V+ and V−. The branch 50A includes amplifiers 20A and 20E and a coil 30A. A power source (not shown) provides power to the amplifiers 20A and 20E. In this example, the amplifiers 20A and 20E are ON to provide the peak power and generate a differential voltage across the coil 30A, which generates a branch output power for the branch 50A.

The branch 50B includes amplifiers 20B and 20F and a coil 30B. A power source (not shown) provides power to the amplifiers 20B and 20F. The amplifiers 20B and 20F are both ON to provide the peak power and generate a differential voltage across the coil 30B, which generates a branch output power for the branch 50B.

The branch 50C includes amplifiers 20H and 20D and a coil 30D. A power source (not shown) provides power to the amplifiers 20H and 20D. In this example, the amplifiers 20H and 20D are ON to provide the peak power and generate a differential voltage across the coil 30D, which generates a branch output power for the branch 50C.

The branch 50D includes amplifiers 20C and 20G and a coil 30C. A power source (not shown) provides power to the amplifiers 20C and 20G. In this example, the amplifiers 20C and 20G are ON to provide the peak power and generate a differential voltage across the coil 30C, which generates a branch output power for the branch 50D.

The amplifiers 20A, 20B, 20C, 20D, 20E, 20F, 20G, and 20H are collectively referred to as amplifiers 20. The coils 30A, 30B, 30C and 30D are collectively referred to as branch coils 30.

The amplifiers 20 are configured to be independently activated, as ON or OFF. Each of the amplifiers connects to AC ground in an OFF state. In this example, the amplifiers 20 are all ON in order to produce the peak power. A DC block component, such as a capacitor, can be included to block a DC voltage between a PA in ON state and a PA in OFF state. It is appreciated that there are example configurations where a DC block component is not needed and/or used.

The secondary winding 106 is configured to combine power from the branches into a single output power. The secondary winding 106 includes a plurality of inductor coils 40A, 40B, 40C and 40D connected in series as shown. They are collectively referred to as coils 40. The coil 40A receives power from the branch coil 30A, the coil 40B receives power from the branch coil 30B, the coil 40C receives power from the branch coil 30C and the coil 40D receives power from the branch coil 30D. The combined power from the coils 40, referred to as the output power, is supplied to a load 202.

Figure 3:
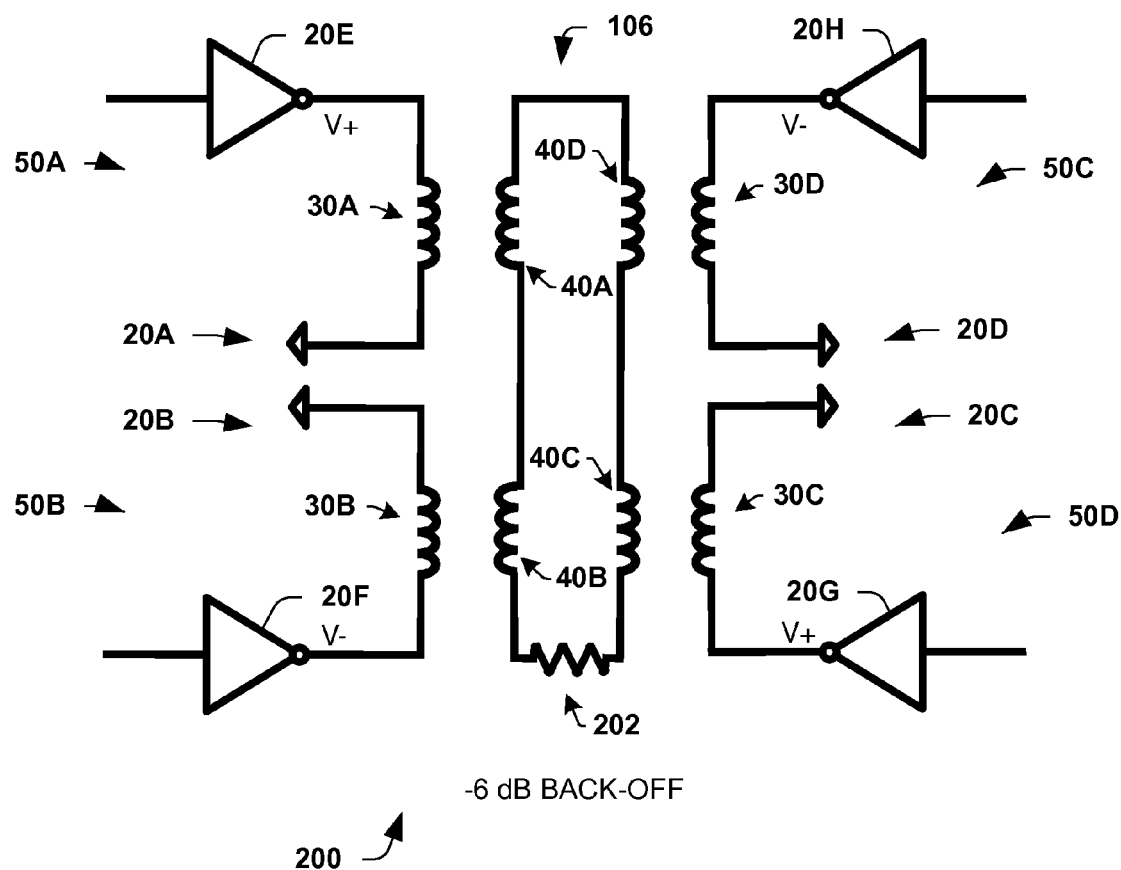
FIG. 3 is a diagram illustrating the power combining system operating at back-off power.

FIG. 3 is a diagram illustrating the power combining system 200 operating at back-off power. The system 200 combines power using a combine ratio of 4:1, in this example. However, it is appreciated that other suitable combine ratios are contemplated.

As described above, the system 200 includes a plurality of branches 50 and a secondary winding 106. The branches 50 can be utilized as the branches 104 in system 100, described above. Similarly, the secondary winding 106 can be used as the secondary winding 106 in the system 100, described above. The system 200 is shown configured to efficiently provide a back-off power.

In order to reduce the power provided by the branches 50, half of the amplifiers 20 are turned OFF resulting in a connection to ground. By only having half of the amplifiers ON, the power provided to the secondary winding 106 is reduced to the back-off level (−6 dB). Additionally, each branch is contributing to the power output, so there is no parasitic power transferred back to any of the branches 50 from the secondary winding 106.

In this configuration, the branches 50A and 50B are configured to provide a differential power and the branches 50C and 50D are also configured to provide a differential power, as shown in the drawing. The branch 50A includes amplifiers 20A and 20E and a coil 30A. A power source (not shown) provides power to the amplifiers 20A and 20E. In this example, the amplifier 20E is ON and the amplifier 20A is OFF in order to provide a reduced power. The amplifier 20E provides a positive voltage (V+) to the coil 30A. The amplifier 20A is OFF, thereby resulting in a connection to ground. The branch 50B includes amplifiers 20B and 20F and a coil 30B. A power source (not shown) provides power to the amplifiers 20B and 20F. The amplifier 20B is OFF and the amplifier 20F is ON in order to provide the reduced power. The amplifier 20F supplies a negative voltage (V−) to the coil 30B. Collectively, the amplifiers 20E (V+) and 20F (V−) provide the differential power across the coils 30A and 30B. Thus, the branches 50A and 50B provide a differential voltage across coils 30A and 30B.

Similarly, the branches 50C and 50D are also configured to provide a differential voltage/power. The branch 50C includes amplifiers 20D and 20H and a coil 30D. A power source (not shown) provides power to the amplifiers 20D and 20H. In this example, the amplifier 20H is ON and the amplifier 20D is OFF in order to provide a reduced power. The amplifier 20H provides a negative voltage (V−) to the coil 30D. The amplifier 20D is OFF, thereby resulting in a connection to ground. The branch 50D includes amplifiers 20C and 20G and a coil 30C. A power source (not shown) provides power to the amplifiers 20B and 20F. The amplifier 20C is OFF and the amplifier 20G is ON in order to provide the reduced power. The amplifier 20F supplies a positive voltage (V+) to the coil 30C. Collectively, the amplifiers 20H (V−) and 20G (V+) provide the differential power across the coils 30D and 30C. As a result, the branches 50C and 50D provide a differential voltage across coils 30D and 30C, with an orientation opposite the differential voltage applied across the coils 30A and 30B. Additionally, it is noted that the amplifiers 20H (V−) and 20E (V+) form a differential pair and the amplifiers 20F (V−) and 20G (V+) form another differential pair.

As stated above, the secondary winding 106 is configured to combine power from the branches into a single output power and includes a plurality of inductor coils 40A, 40B, 40C and 40D connected in series and are collectively referred to as coils 40. The coils 40A and 40B receive power from the coils 30A and 30B and the coils 40D and 40C receiver power from the coils 30D and 30C in this configuration. The combined power from the coils 40, referred to as the output power, is supplied to a load 202.

In this example, the output power is at the back-off level. Other approaches have amplifiers for branches turned off in order to provide the reduced power. However, so doing results in parasitic power being transferred back to OFF branches, thereby wasting power. In contrast, the above configuration shown in FIG. 3 efficiently provides power at reduced power levels, including the back-off power (−6 dB).

Figure 4:
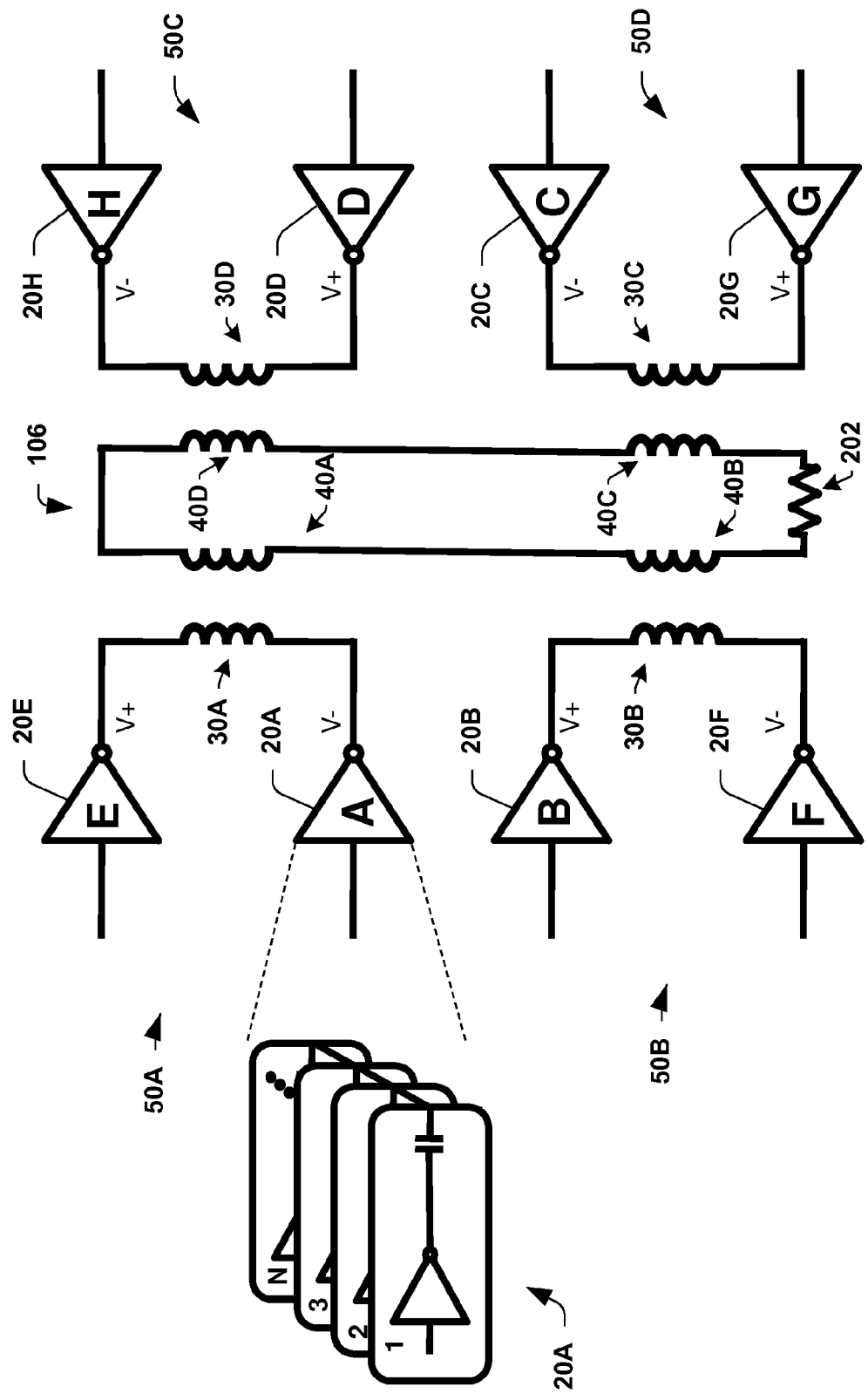
FIG. 4 is a diagram illustrating a power combining system where amplifiers include multiple switched-mode amplifiers.

FIG. 4 is a diagram illustrating a power combining system 400 where amplifiers include multiple switched-mode amplifiers. The switched-mode amplifiers are configured to provide varying levels of power. This example utilizes switched-mode amplifiers, however it is appreciated that other types of amplifiers can be used in addition to or instead of switched-mode amplifiers.

The system 400 and components therein can be utilized in the system 100, described above. Additional description of the components is provided above by referencing the components with the same reference numerals.

As described above, the system 400 includes a plurality of branches 50 and a secondary winding 106. The branches 50 can be utilized as the branches 104 in system 100, described above. Similarly, the secondary winding 106 can be used as the secondary winding 106 in the system 100, described above. The system 200 is shown configured to efficiently provide a back-off power.

Each amplifier 20, also referred to as a power amplifier section, includes a plurality of individual, selectable amplification components, referred to as unit cells. For example, FIG. 4 shows amplifier 20A as including 1 to N unit cells. Each unit cell includes an amplifier and a blocking component. In this example, the blocking component is a capacitor. When ON, the unit cell supplies an amount of power at about 1/N. When OFF, the unit cell does not supply power. If each unit cell provides 1/N of the power for the particular amplifier, turning x of the N on provides x units of power.

In FIG. 3, an example was provided on providing back-off power where half of the power is provided by turning half of the amplifiers 20 OFF, as shown. Configuring the amplifiers 20 with individual amplification components is one suitable technique of providing other power levels.

One example of transitioning from the peak power to the back power is provided. At peak power, all of the amplifiers 20 are turned ON. At the back-off power, amplifiers 20A, 20B, 20D, and 20C are OFF. Instead of turning the amplifiers OFF all at once, a suitable technique is to alternatively turn OFF unit cells one by one. For example, a first pass turns OFF unit cell 1 of 20A, turns OFF unit cell 1 of 20B, turns OFF unit cell 1 of 20C, and turns OFF unit cell 1 of 20D. A second pass turns OFF unit cell 2 of 20A, 20B, 20C and 20D. A number N passes are performed where at the Nth pass, unit cell N of 20A, 20B, 20C and 20D is turned OFF. At this point, the back-off power is provided because amplifiers 20A, 20B, 20D and 20C are OFF, as are their unit cells. This technique provides a suitable transition from the peak power to the back-off power. The system 400 can be transitioned back to peak power by reversing the process to turn the unit cells back ON sequentially.

For differential operation, pairs of unit cells are turned OFF differentially. In this example sequence, unit cell 1 of 20A and 20B are turned OFF and, then unit cell 1 of 20C and 20D are turned OFF for a first pass. Subsequently, unit cell 2 of 20A and 20B are turned OFF and, then unit cell 2 of 20C and 20D are turned OFF for a second pass. At a final pass, unit cell N of 20A and 20B are turned OFF and then unit cell N of 20C and 20D are turned OFF. This sequence facilitates maintaining the differential mode.

Power output can then be further reduced by turning OFF unit cells in the other amplifiers, 20E, 20F, 20G and 20H. A similar sequence is used. For example, a first pass turns OFF unit cell 1 of 20E, turns OFF unit cell 1 of 20F, turns OFF unit cell 1 of 20G, and turns OFF unit cell 1 of 20H. A second pass turns OFF unit cell 2 of 20E, 20F, 20G and 20H. A number N passes are performed where at the Nth pass, unit cell N of 20E, 20F, 20G and 20H is turned OFF. At this point, provided power is at its lowest level and the amplifiers 20 are essentially turned OFF. This technique provides a suitable transition from the back-off to the zero or the low power. The system 400 can be transitioned back to back-off power by reversing the process to turn the unit cells back ON sequentially. It is appreciated that the sequences can also be reversed to transition from low or zero power to back-off power and then to peak power.

The above description illustrates using switched-mode amplifiers and units in a power combining system to transition between power levels, such as peak power, back-off power, and the like. Additionally, other power amplifiers and/or techniques can be utilized. For example, linear power amplifiers can be used and configured to provide varied levels of power.

Figure 5:
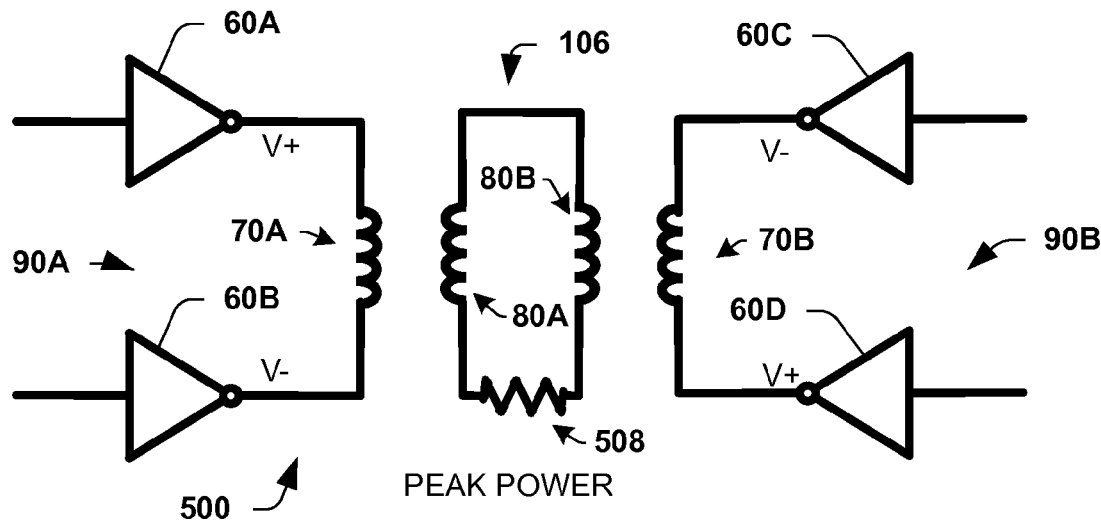
FIG. 5 is a diagram illustrating a power combining system having a combine ratio of 2:1 and operating at peak power.

FIG. 5 is a diagram illustrating a power combining system 500 having a combine ratio of 2:1 and operating at peak power. The system 500 can be incorporated into system 100 described above. Additionally, the system 500 is similar to the system 200, but uses the combine ratio of 2:1 instead of 4:1.

The system 500 includes a plurality of branches 90 and a secondary winding 106. The branches 90 can be utilized as the branches 104 in system 100, described above. Similarly, the secondary winding 106 can be used as the secondary winding 106 in the system 100, described above. The system 200 is shown configured to efficiently provide peak power.

The branches 90 include a first branch 90A and a second branch 90B. The branches 90 are differential in that each supply differential power, as indicated by V+ and V−. The branch 90A includes amplifiers 60A and 60B and a coil 70A. A power source (not shown) provides power to the amplifiers 90A and 90B. In this configuration, the amplifiers 60A and 60B are ON to provide the peak power and generate a differential voltage across the coil 70A, which generates a branch output power for the branch 90A.

The branch 90B includes amplifiers 60C and 60D and a coil 70B. A power source (not shown) provides power to the amplifiers 60C and 60D. The amplifiers 60C and 60D are both ON to provide the peak power and generate a differential voltage across the coil 70B, which generates a branch output power for the branch 90B.

Similar to the amplifiers described above, the amplifiers 60 are configured to be independently activated, as ON or OFF. Each of the amplifiers connects to AC ground in an OFF state. In this example, the amplifiers 20 are all ON in order to produce the peak power. A DC block component, such as a capacitor, can be included to block DC voltage between a PA in ON state and a PA in OFF state. It is appreciated that there are example configurations where a DC block component is not needed and/or used.

The secondary winding 106 is configured to combine power from the branches into a single output power. In this example, the secondary winding 106 is configured for the 2:1 combine ratio, meaning it receives power from two branches and combine the power into a single output power. The secondary winding 106 includes a plurality of inductor coils 80A and 80B connected in series as shown. They are collectively referred to as coils 80. The coil 80A receives power from the branch coil 70A and the coil 80B receives power from the branch coil 70B. The combined power from the coils 80, referred to as the output power, is supplied to a load 508.

Figure 6:
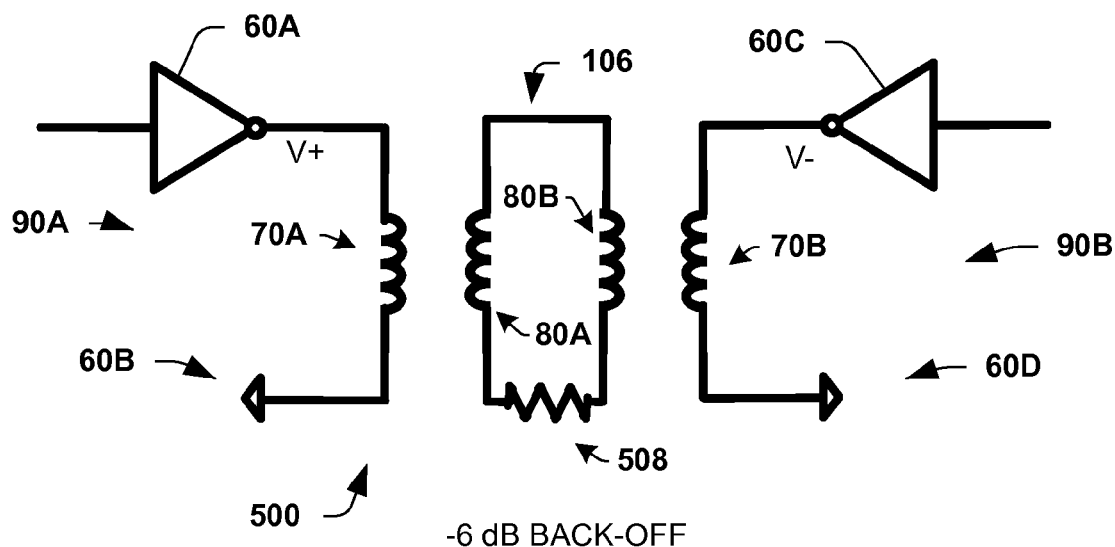
FIG. 6 is a diagram illustrating the power combining system having a combine ratio of 2:1 and operating at back-off power.

FIG. 6 is a diagram illustrating the power combining system 500 having a combine ratio of 2:1 and operating at back-off power. The system 500 can be incorporated into system 100 described above. FIG. 6 shows the system 500 configured to provide the back-off power by turning OFF some of the amplifiers 60 so that each branch provides a reduced power, the back-off power in an efficient manner.

As described above, the system 500 includes a plurality of branches 90 and a secondary winding 106. The branches 90 can be utilized as the branches 104 in system 100, described above. Similarly, the secondary winding 106 can be used as the secondary winding 106 in the system 100, described above.

In order to provide reduced power levels, a portion of the amplifiers 60 are turned OFF. In this configuration, half of the amplifiers 60 are turned OFF in order to provide the back-off power (−6 dB) by the system 500.

Each of the branches, 90A and 90B, contribute to the output power. As a result, no parasitic power is transferred from the secondary coil 106 to either of the branches 90A and 90B.

The branch 90A includes amplifiers 60A and 60B and a coil 70A. The amplifier 60A is turned ON and supplies a positive voltage (V+) to the coil 70A. The amplifier 60B is turned OFF and provides an AC connection to ground. Similarly, the branch 90B includes amplifiers 60C and 60D and a coil 70B. The amplifier 60C is turned ON and supplies a negative voltage (V−) to the coil 70B. The amplifier 60D is turned OFF and provides an AC connection to ground.

The secondary winding 106 is configured to combine the power from the branches 90A and 90B into a single output power. The winding 106 includes coil 80A and coil 80B, in this example. The coil 80A receives power from branch 90A via the branch coil 70A. The coil 80B receives power from branch 90B via the branch coil 70B. Power from the coils 80 is combined into a single output power, which is applied to the load 508.

Other power levels can be provided by the system 500 by using unit cells for each of the amplifiers, as described above with regard to FIG. 4. The unit cells can be sequentially turned ON and/or OFF in order to obtain power levels between peak power and the back-off power and to obtain power levels below the back-off power.

Figure 7:
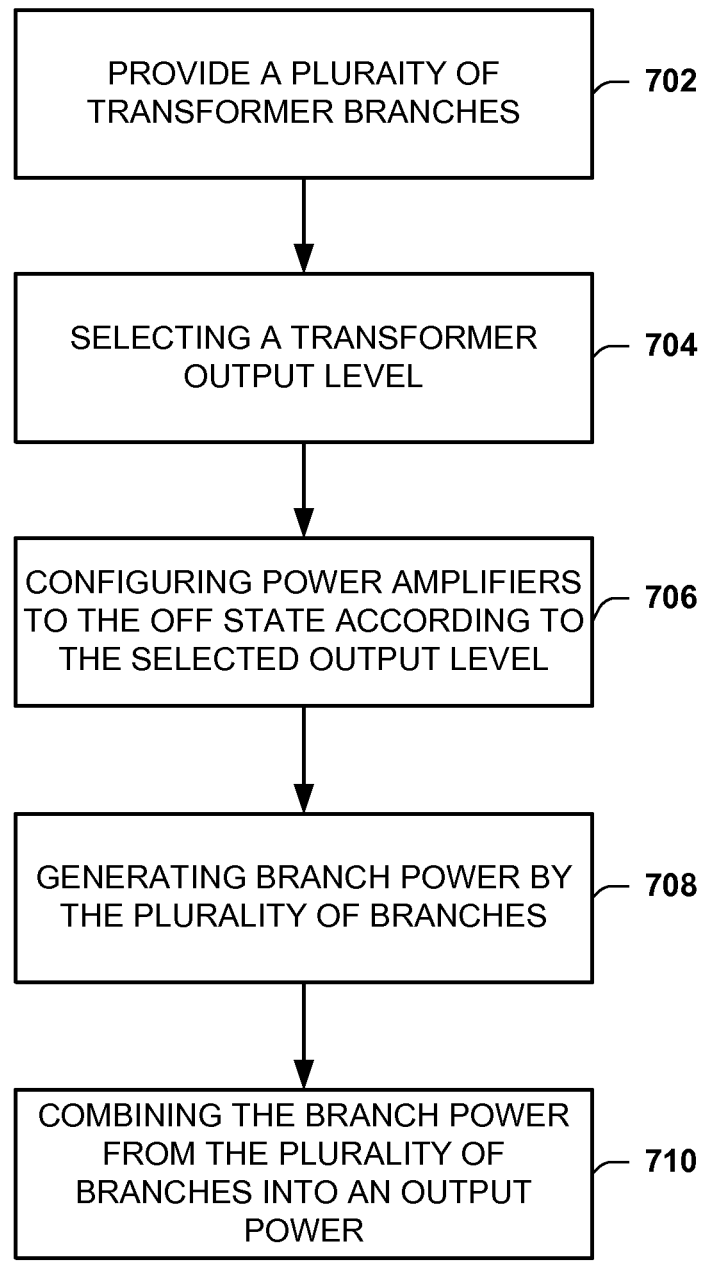
FIG. 7 is a flow diagram illustrating a method of combining power.

FIG. 7 is a flow diagram illustrating a method 700 of combining power. The method 700 generates and combines power from multiple branches into a single output power. Additionally, the method 700 efficiently generates the output power, even at levels below peak power.

At block 702, transformer branches are provided. The branches, such as those described above, are part of a power combining transformer. The branches include power amplifiers that have a selectable OFF state, which provides a connection to AC ground. The branches also include an ON state where they supply a voltage to an inductive coil.

A transformer output power level is selected at block 704. The output power level includes peak power, back-off power, and various other power levels that can be provided.

One or more of the power amplifiers are configured to an OFF state according to the selected output power level at block 706. For example, half the power amplifiers are configured to be OFF on the selected level being the back-off power. It is also appreciated that the power amplifiers can include amplification units, such as those described above. The amplification units are also able to be configured to an ON state or an OFF state. Additionally, it is also appreciated that one or more of the power amplifiers can be configured to an ON state and/or an ON state having a selected or varied power level. For example, linear amplifiers used as a power amplifier can be configured to provide full and/or less than full amounts of power.

Branch power is generated from the plurality of branches at block 708. The branch power is generated where the ON amplifiers provide a voltage to a coil and the OFF amplifiers provide an AC ground connection.

The branch power from the plurality of branches is combined at block 710 using a secondary winding. The secondary winding includes coils for the branches. The coils collect power from the branches and combine the power into a single output power. Examples of the secondary winding are provided above.

It is appreciated that the method 700 and/or systems shown above can be utilized to change from one selected transformer output power level to another level/mode. For static changes, which is an abrupt change in power from one level to a next, such as from 9 dBm to 15 dBm, a single change in states of the power amplifiers in the branches can be utilized. For dynamic changes, which include multiple, finer changes or transitions from one selected transformer output power level to another, a suitable set of transitions can be used. For example, FIG. 4 and its description above describe multiple passes to transition from one power level to another.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A system for combining power includes a plurality of branches and a secondary winding. The plurality of branches are configured to provide branch power. Each of the branches contribute to the branch power at non-peak power or power levels. The secondary winding is configured to combine the branch power from the plurality of branches into an output power.

In one example, the system further includes a mode select component coupled to the plurality of branches. The mode select component is configured to control branch power or portions of branch power supplied by each of the branches.

In another example of any of the above, the output power is provided using a combine ratio of 4:1.

In another example of any of the above, the output power is provided using a combine ratio of 2:1.

In another example of any of the above, each branch includes a switched-mode amplifier having an OFF state configured to provide a connection to AC ground and an ON state configured to provide a selected AC voltage.

In another example of any of the above, each branch includes a coil configured to provide a portion of the branch power.

In another example of any of the above, each branch includes a power amplifier having a plurality of unit cells.

In another example of any of the above, the plurality of unit cells are configured to provide a unit of power in an ON state and a connection to AC ground in an OFF state.

In another example of any of the above, the branch power is differential.

In another example of any of the above, the secondary winding includes a plurality of coils. Each coil corresponds to one of the plurality of branches.

In another example of any of the above, the output power is at a back-off power of −6 dB.

In another example of any of the above, the output power is at peak power.

A system for combining power includes a first branch and a second branch. The first branch has a first amplifier, a coil, and a second amplifier. The coil is coupled to the first amplifier. The second amplifier is coupled to the coil. The second amplifier is configured to provide a selected voltage (AC) in an ON state and a connection to AC ground in an OFF state. The second branch has a first amplifier, a coil, and a second amplifier. The coil is coupled to the first amplifier. The second amplifier is coupled to the coil. The second amplifier of the second branch is configured to provide a selected voltage (AC) in an ON state and a connection to AC ground in an OFF state.

In another example of the system, the system includes a secondary winding coupled to the first branch and the second branch. The secondary winding includes a first coil coupled to the coil of the first branch and a second coil coupled to the coil of the second branch.

In another example of any of the above, the second amplifier of the first branch includes unit cells having an OFF state and an ON state.

In another example of any of the above, the first amplifier of the first branch is configured to provide appositive voltage and the second amplifier of the first branch is configured in the OFF state to provide the connection to AC ground.

In another example of any of the above, the first amplifier of the second branch is configured to provide a negative voltage and the second amplifier of the second branch is configured in the OFF state to provide the connection to AC ground.

A method of performing power combining is disclosed. A transformer having a plurality of branching with power amplifiers is provided. The power amplifiers have a selectable OFF state that provides a connection to ground or AC ground. A transformer output power level is selected. One or more of the power amplifiers are configured to the OFF state according to the selected transformer output power level. The branch power from the plurality of branches is combined into an output power having the selected transformer output power level.

In an example of the above method, the selected transformer output power level is back-off power.

In another example of any of the above, configuring the one or more power amplifiers to the OFF state involves sequentially configuring unit cells of the one or more power amplifiers to the OFF state.

In another example of any of the above, the method further includes changing from the selected transformer output power level statically and/or dynamically.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well.

Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. The any component or structure includes a processer executing instructions in order to perform at least portions of the various functions. In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. A system for combining power, the system comprising:
a plurality of branches configured to generate branch power, each branch comprising a first power amplifier and a second power amplifier, each of the first power amplifier and the second power amplifier having an output node coupled to opposing ends of a coil, wherein the first power amplifier and the second power amplifier comprises a plurality of selectable unit cells having an ON state and an OFF state and wherein each of the plurality of branches contribute to the branch power at a non-peak power mode;
a secondary winding configured to combine the branch power from the plurality of branches into an output power; and
a mode select circuit configured to,
generate control signals that operate the plurality of branches in a peak power mode, wherein the control signals select each of the plurality of unit cells in both the first power amplifier and the second power amplifier of each of the plurality of branches to the ON state, wherein the unit cell provides power, and
generate control signals that operate the plurality of branches in the non-peak power mode, wherein the control signals selects at least one unit cell in the first power amplifier or the second power amplifier of each of the plurality of branches to the ON state, wherein the unit cell provides power.

2. The system of claim 1, wherein the mode select circuit is coupled to the plurality of branches and is configured to control the branch power supplied by each of the branches.

3. The system of claim 1, wherein the output power is generated using a combine ratio of 4:1.

4. The system of claim 1, wherein the output power is generated using a combine ratio of 2:1.

5. The system of claim 1, wherein the first power amplifier and the second power amplifier have an OFF state configured to provide a connection to AC ground and an ON state configured to provide a selected AC voltage.

6. The system of claim 1, wherein the coil is configured to generate a portion of the branch power.

7. The system of claim 1, wherein the plurality of selectable unit cells are configured to provide a unit of power in the ON state and a connection to AC ground in the OFF state.

8. The system of claim 1, wherein the branch power is differential.

9. The system of claim 1, wherein the secondary winding includes a plurality of coils, wherein each of the plurality of coils corresponds to one of the plurality of branches.

10. The system of claim 1, wherein the output power is at a back-off power of −6 dB.

11. The system of claim 1, wherein the output power is at peak power.

12. A system for combining power, the system comprising:
a first branch having a first coil, a first amplifier coupled to a first end of the first coil and a second amplifier coupled to a second, different end of the first coil, wherein the first amplifier and the second amplifier comprises a plurality of selectable unit cells and wherein the first amplifier and the second amplifier is configured to generate a first selected voltage in an ON state and a connection to AC ground in an OFF state;
a second branch having a second coil, a third amplifier coupled to a first end of the second coil and a fourth amplifier coupled to a second, different end of the second coil, wherein the third amplifier and the fourth amplifier comprises a plurality of selectable unit cells and wherein the third amplifier and the fourth amplifier is configured to generate a second selected voltage in an ON state and a connection to AC ground in an OFF state; and a mode select circuit configured to generate a first control signal and a second control signal that operate the first branch and the second branch respectively, in two modes, wherein a first mode comprises a peak power mode, wherein the first control signal selects each of the plurality of the selectable unit cells in both the first amplifier and the second power amplifier in the first branch to an ON state, wherein the unit cells provide power and wherein the second control signal selects each of the plurality of the selectable unit cells in both the third amplifier and the fourth amplifier in the second branch to the ON state, and wherein a second mode comprises a non-peak power mode, wherein the first control signal selects at least one of the plurality of the selectable unit cells in the first amplifier or the second amplifier in the first branch to the ON state, and wherein the second control signal turns at least one of the plurality of the selectable unit cells in the third amplifier or the fourth amplifier in the second branch to the ON state.

13. The system of claim 12, further comprising a secondary winding coupled to the first branch and the second branch, wherein the secondary winding includes a third coil coupled to the first coil and a fourth coil coupled to the second coil.

14. The system of claim 12, wherein the plurality of selectable unit cells are configured to provide a unit of power in the ON state and a connection to AC ground in an OFF state.

15. The system of claim 12, wherein the first amplifier of the first branch is configured to provide a positive voltage and the second amplifier of the first branch is configured to be in the OFF state to provide the connection to AC ground.

16. The system of claim 15, wherein the third amplifier of the second branch is configured to provide a negative voltage and the fourth amplifier of the second branch is configured to be in the OFF state to provide the connection to AC ground.

17. A method of performing power combining, the method comprising:

providing a transformer having a plurality of branches comprising a first power amplifiers and a second power amplifier each of the first power amplifier and the second power amplifier having an output node coupled to opposing ends of a coil, wherein the first power amplifier and the second power amplifier comprises a plurality of unit cells and wherein each of the first power amplifier and the second power amplifiers have a selectable OFF state that operates as a connection to ground and an ON state configured to provide a selected AC voltage;

selecting a transformer output power level;

selecting each of the plurality of the selectable unit cells in both the first amplifier and the second power amplifier in each branch to the ON state for peak power mode, and selecting at least one of the plurality of the selectable unit cells in the first power amplifier or the second power amplifier in each branch to the ON state for non-peak power mode; and combining branch power from the plurality of branches into an output power having the selected transformer output power level.

18. The method of claim 17, wherein the selected transformer output power level is back-off power.

19. The method of claim 17, wherein configuring the first power amplifiers and the second amplifier to the ON state involves sequentially configuring unit cells of the first power amplifier and the second power amplifiers to the ON state, respectively.

20. The method of claim 17, further comprising changing from the selected transformer output power level statically or dynamically.

* * * * *